(12) United States Patent
Ross

(10) Patent No.: US 7,466,787 B1
(45) Date of Patent: Dec. 16, 2008

(54) MULTI-STAGE PHASE DETECTOR

(75) Inventor: James P. Ross, Lakeville, MN (US)

(73) Assignee: Xilinx, Inc., San Jose, CA (US)

( * ) Notice: Subject to any disclaimer, the term of this patent is extended or adjusted under 35 U.S.C. 154(b) by 810 days.

(21) Appl. No.: 10/994,053

(22) Filed: Nov. 19, 2004

(51) Int. Cl.
*H03D 3/24* (2006.01)

(52) U.S. Cl. .................. 375/376; 375/354; 375/373; 327/147; 327/156

(58) Field of Classification Search ............... 375/376, 375/373, 375; 327/141, 147, 150, 151, 156
See application file for complete search history.

(56) References Cited

U.S. PATENT DOCUMENTS

| | | | | |
|---|---|---|---|---|
| 5,541,929 | A * | 7/1996 | Jokura | 370/337 |
| 5,917,383 | A * | 6/1999 | Tso et al. | 331/57 |
| 5,963,063 | A * | 10/1999 | Sugihashi | 327/94 |
| 5,991,270 | A * | 11/1999 | Zwan et al. | 370/249 |
| 6,266,799 | B1 * | 7/2001 | Lee et al. | 716/6 |
| 6,522,183 | B2 * | 2/2003 | Sumi | 327/159 |
| 6,538,475 | B1 * | 3/2003 | Johansen et al. | 327/12 |
| 6,545,507 | B1 * | 4/2003 | Goller | 326/93 |
| 6,560,306 | B1 * | 5/2003 | Duffy et al. | 375/376 |
| 6,815,987 | B2 * | 11/2004 | Hsu et al. | 327/156 |
| 7,098,685 | B1 * | 8/2006 | Agrawal et al. | 326/38 |
| 7,142,621 | B2 * | 11/2006 | Vallet et al. | 375/355 |
| 7,170,964 | B2 * | 1/2007 | Kocaman et al. | 375/376 |
| 7,183,864 | B1 * | 2/2007 | Gutnik | 331/57 |

* cited by examiner

*Primary Examiner*—Mohammad H Ghayour
*Assistant Examiner*—Sophia Vlahos
(74) *Attorney, Agent, or Firm*—Timothy Markison

(57) ABSTRACT

A multi-stage phase detector (four stages in one described embodiment) comprises a plurality of data paths and phase paths that are buffered from a received serial data input stream to reduce loading. Each data path recovers a data bit and further functions as a transition detector to detect consecutive data bits having similar logic states. An exclusive NOR gate in the data path produces a control signal to disable a multiplexer in the phase path when two data bits have similar logic states. Each phase path produces a sample of a serial data input stream and produces the sample to a multiplexer for coupling to a transconductance module. The multiplexer output is coupled to or decoupled from the transconductance module by the control signal from the data path to maintain phase-lock.

33 Claims, 9 Drawing Sheets four-stage phase detector 78 programmable logic device 10 programmable MGTs 14 - 28 programmable fabric phase-locked loop phase detector data path and phase path four-stage phase detector 78 sample and hold module

DXNOR gate

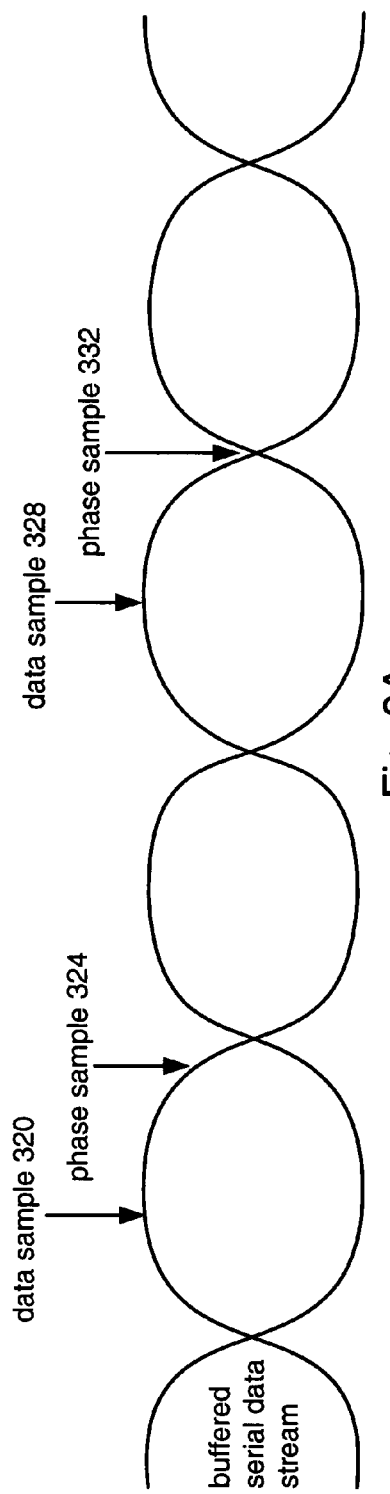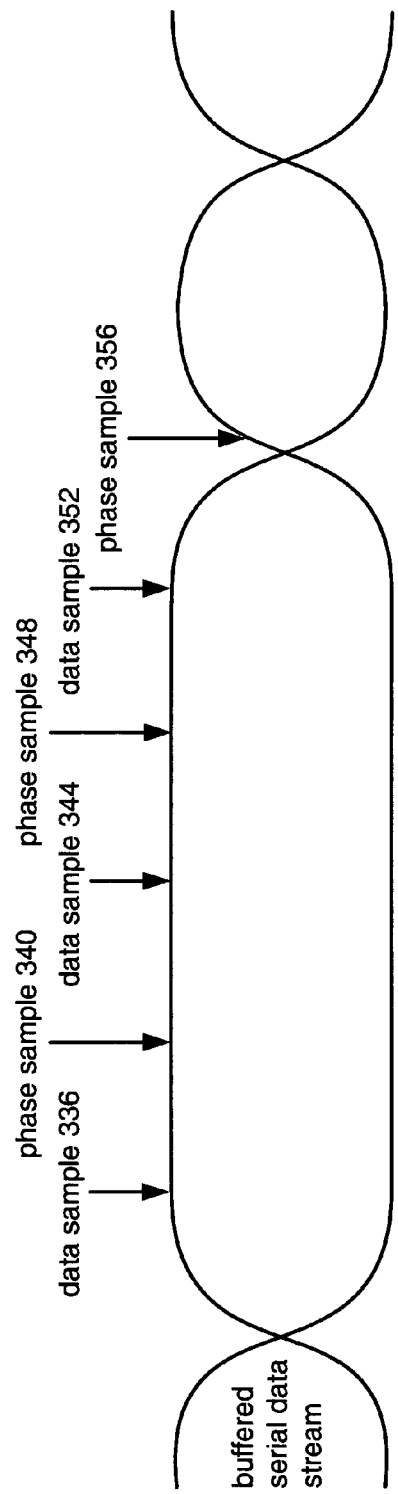

method of detecting a phase difference in high data rate differential serial data

MULTI-STAGE PHASE DETECTOR

BACKGROUND OF THE INVENTION

1. Technical Field of the Invention

This invention relates generally to communication systems and more particularly to phase detector circuits used therein.

2. Description of Related Art

Communication systems are known to transport large amounts of data between a plurality of end user devices, which, for example, include telephones (i.e., land line and cellular), facsimile machines, computers, television sets, personal digital assistants, etc. As is known, such communication systems may be local area networks (LANs) and/or wide area networks (WANs) that are stand-alone communication systems or interconnected to other LANs and/or WANs as part of a public switched telephone network (PSTN), packet switched data network (PSDN), integrated service digital network (ISDN), or the Internet. As is further known, communication systems include a plurality of system equipment to facilitate the transporting of data. Such system equipment includes, but is not limited to, routers, switches, bridges, gateways, protocol converters, frame relays, and private branch exchanges.

The transportation of data within communication systems is governed by one or more standards that ensure the integrity of data conveyances and fairness of access for data conveyances. For example, there are a variety of Ethernet standards that govern serial transmissions within a communication system at data rates of 10 megabits-per-second, 100 megabits per second, 1 gigabit per second and beyond. Synchronous Optical NETwork (SONET), for example, currently provides for up to 10 gigabits per second. In accordance with such standards, many system components and end user devices of a communication system transport data via serial transmission paths. Internally, however, the system components and end user devices may process data in a parallel manner. As such, each system component and end user device must receive the serial data and convert the serial data into parallel data without loss of information. After processing the data, the parallel data must be converted back to serial data for transmission without loss of information.

Accurate recovery of information from high-speed serial transmissions typically requires transceiver components that operate at clock speeds equal to or higher than the received serial data rate. Higher clock speeds require oscillator circuits to have gain-bandwidth products to sustain high frequency oscillations while maintaining low phase noise. Higher clock speeds limit the usefulness of prior art clock recovery circuits that require precise alignment of signals to recover clock and/or data. Higher data rates require greater bandwidth for a feedback loop of the clock recovery circuits to operate correctly. Some prior art designs are bandwidth limited. High data rates also increase the loading on a transmitter due to parasitic capacitance, wiring inductance, and routing resistance. Some prior art multi-phase clock designs place an excessive load on the high data rate transmitter.

As the demand for data throughput increases, so do the demands on a high-speed serial transceiver. The increased throughput demands are pushing some current integrated circuit manufacturing processes to their operating limits. Integrated circuit processing limits (e.g., device parasitics, trace sizes, propagation delays, device sizes) and integrated circuit (IC) fabrication limits (e.g., IC layout, frequency response of the packaging, frequency response of bonding wires) limit the speed at which the high-speed serial transceiver may operate without excessive jitter performance or phase noise performance.

One solution for high-speed serial transceivers is to use an IC technology that inherently provides for greater speeds. For instance, switching from a Complementary Metal-Oxide Semiconductor (CMOS) process to a silicon germanium or gallium arsenide process would allow integrated circuit transceivers to operate at greater speeds, but at substantially increased manufacturing costs. CMOS is more cost effective and provides easier system integration. Currently, for most commercial-grade applications, including communication systems, such alternate integrated circuit fabrication processes are too cost prohibitive for widespread use.

Modern communication systems, including high data rate communication systems, typically include a plurality of circuit boards that communicate with each other by way of signal traces, bundled data lines, back planes, etc. Accordingly, designers of high data rate communication transceiver devices often have conflicting design goals that relate to the performance of the particular device. For example, there are many different communication protocols specified for data rates that range from 2.48832 gigabits per second for OC48, to 9.95 gigabits per second for OC192. Other known standards define data rates of 2.5 gigabits per second (INFINI-BAND) or 3.125 gigabits per second (XAUI). For example, one protocol may specify a peak voltage range of 200-400 millivolts, while another standard specifies a mutually exclusive voltage range of 500-700 millivolts. Thus, a designer either cannot satisfy these mutually exclusive requirements (and therefore cannot support multiple protocols) or must design a high data rate transceiver device that can adapt according to the protocol being used for the communications.

Along these lines, programmable logic devices, and more particularly, field programmable gate array (FPGA) circuits are gaining in popularity for providing the required flexibility and adaptable performance, as described above, for those designers that seek to build one device that can operate according to multiple protocols. Thus, while FPGA technology affords a designer an opportunity to develop flexible and configurable hardware circuits, specific designs that achieve the desired operations must still be developed at differing clock rates, some of which may be faster than internal clocks. Accordingly, there is a need for a method and apparatus that can accurately process high data rate serial transmissions without placing an excessive load on the serial transmissions source while operating with an internal clock rate that is lower than the high data rate transmissions.

BRIEF SUMMARY OF THE INVENTION

A method and apparatus of the present invention comprises a four-stage phase detector to solve the aforementioned problems. The phase detector comprises a plurality of data paths and phase paths that are buffered from a received serial data input stream to reduce loading. The phase detector operates on a multi-phase differential clock received from a ring oscillator to reduce the operating rate of the phase detector components.

Each data path recovers a data bit and further functions as a transition detector to detect consecutive buffered serial data stream data bits having similar logic states wherein each data path produces a control signal to indicate the presence or absence of transitions in consecutive data bits. Each phase path produces a sample of the buffered serial data stream and produces the sample to a multiplexer for coupling to a transconductance module in a ring oscillator feedback path.

The multiplexer output is coupled to or decoupled from the transconductance module by the data path control signal to control a VCO input voltage. The VCO input voltage adjusts the bias in a ring oscillator operating as a voltage controlled oscillator to maintain phase-lock.

Each data path comprises a sample and hold module, a dynamic latch and a logic module coupled in series. The sample and hold module samples the buffered serial data stream and holds the sample in a capacitor configured MOSFET in the sample and hold module. The dynamic latch operates as a one-bit digital-to-analog converter to receive the sample from the sample and hold module and to produce a full scale recovered data bit from each sample of the buffered serial data stream. The logic module comprises a differential exclusive NOR (DXNOR) gate that is formed to function as a transition detector. The DXNOR gate receives the recovered data bit and a previously recovered data bit and produces a control signal based on the logic states of the recovered data bit and the previously recovered data bit. A logic zero is produced when the two data bits have dissimilar logic states indicating a transition in consecutive data bits of the buffered serial data stream. Conversely, a logic one is produced when the two data bits have similar logic states indicating a lack of transition in consecutive data bits.

The phase path samples the buffered serial data stream to produce an output voltage that adjusts the oscillating frequency of the ring oscillator to maintain phase-lock. When phase-locked, the phase path maintains the phase sample at a zero crossing in the buffered serial data stream while the data sample is maintained at a peak of the data bit. The multiplexer in the phase path couples or decouples the output voltage to the ring oscillator based on the logic state of the control signal received from the data path. The multiplexer is coupled when the control signal is logic zero and decoupled when the control signal is logic one.

The above-referenced description of the summary of the invention captures some, but not all, of the various aspects of the present invention. The claims are directed to some of the various other embodiments of the subject matter towards which the present invention is directed. In addition, other aspects, advantages and novel features of the invention will become apparent from the following detailed description of the invention when considered in conjunction with the accompanying drawings.

BRIEF DESCRIPTION OF THE DRAWINGS

FIGS. 8A and 8B illustrate buffered serial data stream sampling with data transitions and without data transitions, respectively, according to one embodiment of the present invention.

DETAILED DESCRIPTION OF THE INVENTION

Figure 1:
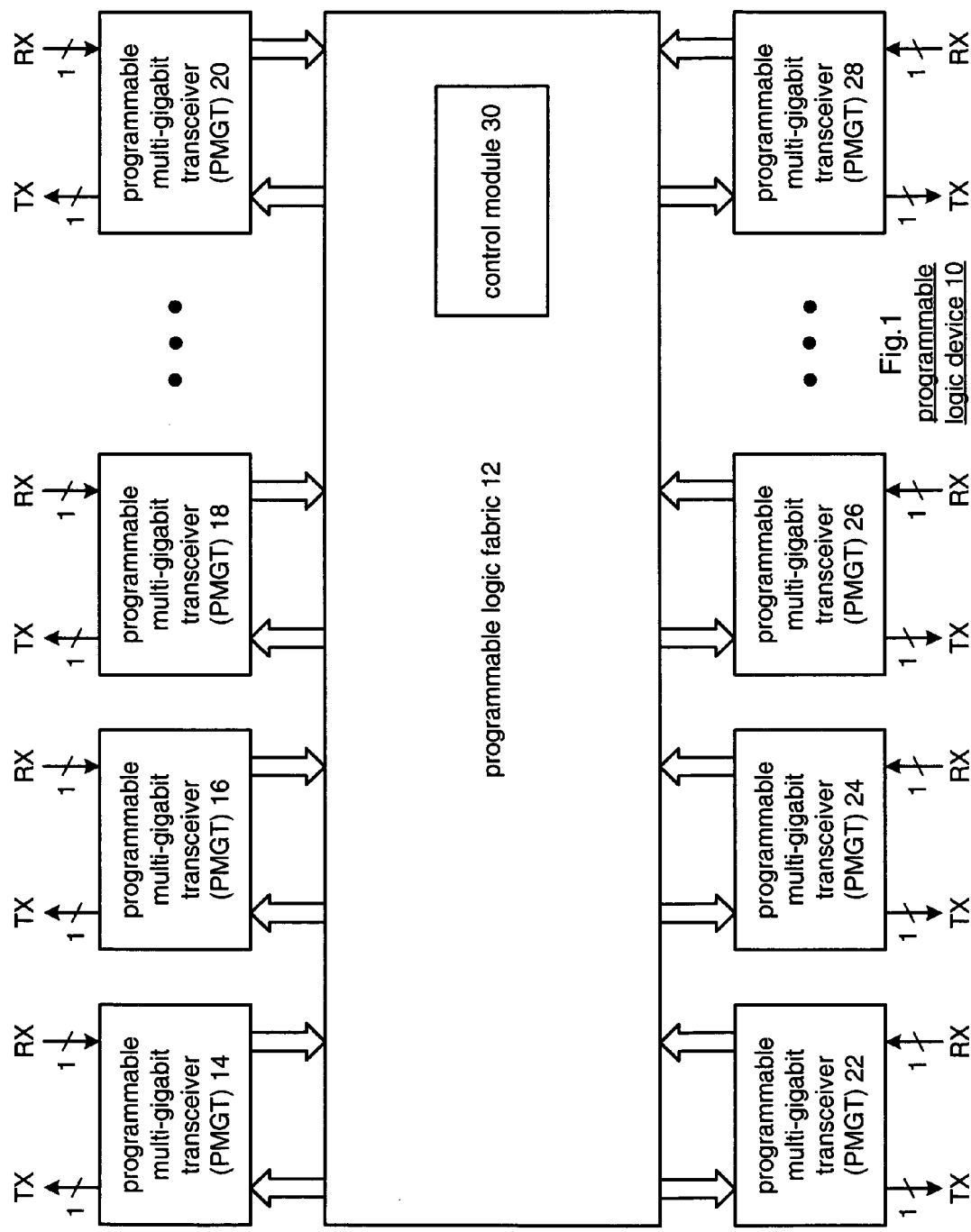
FIG. 1 is a schematic block diagram of a programmable logic device that includes programmable logic fabric, a plurality of programmable multi-gigabit transceivers (PMGTs) and a control module.

FIG. 1 is a schematic block diagram of a programmable logic device 10 that includes programmable logic fabric 12, a plurality of programmable multi-gigabit transceivers (PMGTs) 14-28 and a control module 30. The programmable logic device 10 may be a programmable logic array device, a programmable array logic device, an erasable programmable logic device, and/or a field programmable gate array (FPGA). When the programmable logic device 10 comprises an FPGA, the programmable logic fabric 12 may be implemented as a symmetric array configuration, a row-based configuration, a sea-of-gates configuration, and/or a hierarchical programmable logic device configuration. The programmable logic fabric 12 may further include at least one dedicated fixed processor, such as a microprocessor core, to further facilitate the programmable flexibility offered by programmable logic device 10.

The control module 30 may be contained within the programmable logic fabric 12 or it may be a separate module. In either implementation, control module 30 generates control signals to program transmit and receive sections of each of the PMGTs 14-28. In general, each of the PMGTs 14-28 performs a serial-to-parallel conversion on receive data and performs a parallel-to-serial conversion on transmit data. The parallel data may be, for instance, 8-bits wide, 16-bits wide, 32-bits wide, or 64-bits wide.

Typically, the serial data will be a 1-bit stream of data that may be a binary level signal, a multi-level signal, etc. Further, two or more programmable multi-gigabit transceivers may be bonded together to provide greater transmitting speeds. For example, if PMGTs 14, 16 and 18 are transceiving data at 3.125 gigabits per second, the PMGTs 14, 16 and 18 may be bonded together such that the effective serial data rate is approximately 3 times 3.125 gigabits per second.

Each of the programmable multi-gigabit transceivers 14-28 may be individually programmed to conform to separate standards. In addition, the transmit path and receive path of each programmable multi-gigabit transceiver 14-28 may be separately programmed such that the transmit path of a transceiver is supporting one standard while the receive path of the same transceiver is supporting a different standard. Further, the serial data rates of the transmit path and receive path may be programmed, for example, from 1 gigabit per second to tens of gigabits per second. The size of the parallel data in the transmit and receive sections, or paths, is also programmable and may vary, for instance, from 8-bits, 16-bits, 32-bits, or 64-bits.

Figure 2:
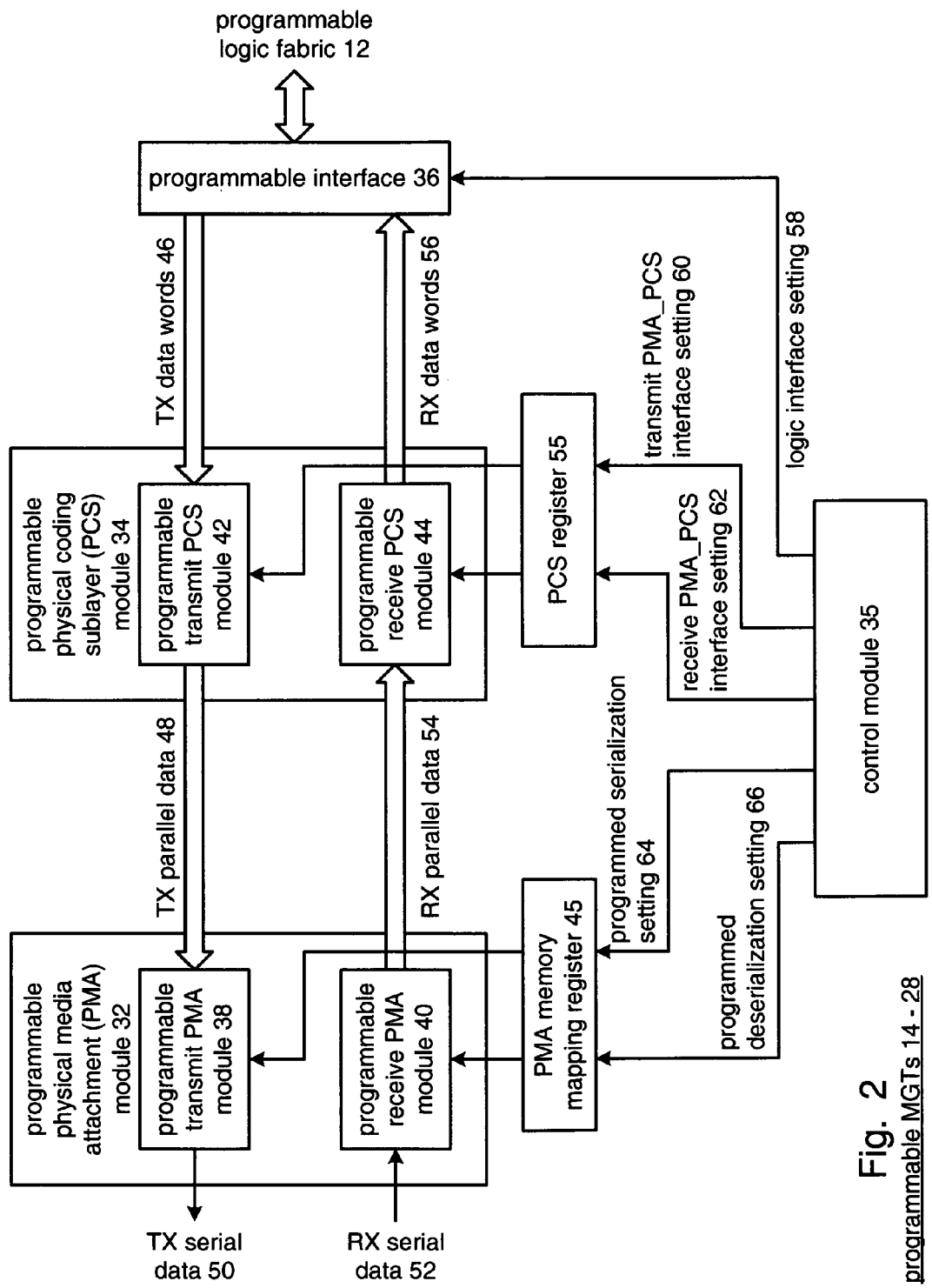
FIG. 2 is a schematic block diagram of one embodiment of a representative one of the programmable multi-gigabit transceivers.

FIG. 2 is a schematic block diagram of one embodiment of a representative one of the programmable multi-gigabit transceivers 14-28. As shown, the programmable multi-gigabit transceiver 14-28 includes a programmable physical media attachment (PMA) module 32, a programmable physical coding sub-layer (PCS) module 34, a programmable interface 36, a control module 35, a PMA memory mapping register 45 and a PCS register 55. The control module 35, based on the desired mode of operation for the individual programmable multi-gigabit transceiver 14-28, generates a programmed deserialization setting 66, a programmed serialization setting 64, a receive PMA_PCS interface setting 62, a transmit PMA_PCS interface setting 60, and a logic interface setting 58. The control module 35 may be a separate device within each of the programmable multi-gigabit transceivers or included partially or entirely within the control module 30 of FIG. 1.

In either embodiment of the control module 35, the programmable logic device control module 30 determines the corresponding overall desired operating conditions for the programmable logic device 10 and provides the corresponding operating parameters for a given programmable multi-gigabit transceiver to its control module 35, which generates the settings 58-66.

The programmable PMA module 32 includes a programmable transmit PMA module 38 and a programmable receive PMA module 40. The programmable transmit PMA module 38 is operably coupled to convert transmit parallel data 48 into transmit serial data 50 in accordance with the programmed serialization setting 64. The programmed serialization setting 64 indicates the desired rate of the transmit serial data 50, the desired rate of the transmit parallel data 48, and the data width of the transmit parallel data 48. The programmable receive PMA module 40 is operably coupled to convert receive serial data 52 into receive parallel data 54 based on the programmed deserialization setting 66. The programmed deserialization setting 66 indicates the rate of the receive serial data 52, the desired rate of the receive parallel data 54, and the data width of the receive parallel data 54. The PMA memory mapping register 45 may store the programmed serialization setting 64 and the programmed deserialization setting 66.

The programmable PCS module 34 includes a programmable transmit PCS module 42 and a programmable receive PCS module 44. The programmable transmit PCS module 42 receives transmit data words 46 from the programmable logic fabric 12 via the programmable interface 36 and converts them into the transmit parallel data 48 in accordance with the transmit PMA_PCS interface setting 60. The transmit PMA_PCS interface setting 60 indicates the rate of the transmit data words 46, the size of the transmit data words (e.g., one byte, two bytes, three bytes, four bytes) and the corresponding transmission rate of the transmit parallel data 48. The programmable receive PCS module 44 converts the receive parallel data 54 into receive data words 56 in accordance with the receive PMA_PCS interface setting 62. The receive PMA_PCS interface setting 62 indicates the rate at which the receive parallel data 54 will be received, the width of the receive parallel data 54, the transmit rate of the receive data words 56 and the word size of the receive data words 56.

The control module 35 also generates the logic interface setting 58 that provides the rates at which the transmit data words 46 and receive data words 56 will be transceived with the programmable logic fabric 12. Note that the transmit data words 46 may be received from the programmable logic fabric 12 at a different rate than the receive data words 56 are provided to the programmable logic fabric 12.

As one of average skill in the art will appreciate, each of the modules within the programmable PMA module 32 and programmable PCS module 34 may be individually programmed to support a desired data transfer rate. The data transfer rate may be in accordance with a particular standard such that the receive path, i.e., the path through programmable receive PMA module 40 and the programmable receive PCS module 44 may be programmed in accordance with one standard, while the transmit path, i.e., the path through the programmable transmit PCS module 42 and the programmable transmit PMA module 38, may be programmed in accordance with the same or another standard.

Figure 3:
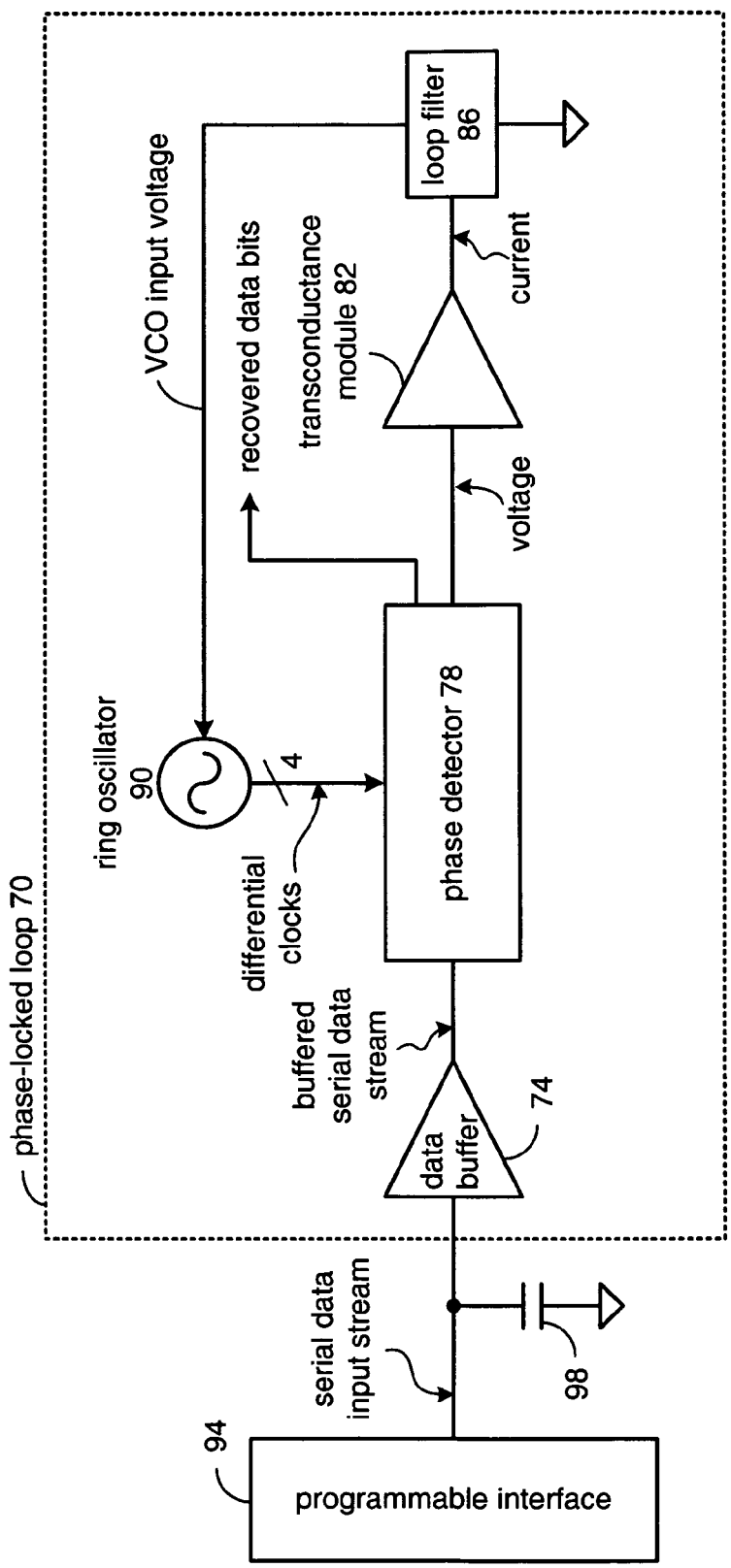
FIG. 3 is a programmable fabric phase-locked loop according to one embodiment of the present invention.

FIG. 3 is a programmable fabric phase-locked loop according to one embodiment of the present invention. Phase-locked loop 70 comprises a data buffer 74, a phase detector 78, a transconductance module 82, a loop filter 86, and a ring oscillator 90. In this embodiment of the present invention, data buffer 74 is formed external to phase detector 78. In an alternate embodiment, data buffer 74 is formed as a component within phase detector 78. Referring now to FIG. 3, data buffer 74 is operably coupled to receive a high data rate serial data input stream from a programmable interface 94, and to produce therefrom a buffered serial data stream. A capacitor 98 represents stray and parasitic capacitance present in the circuits. As is known to one of average skill in the art, a capacitor's impedance is an inverse function of frequency. Stated differently, the capacitor has lower impedance at higher frequencies and is, therefore, a higher load on programmable interface 94 as data rates increase. One aspect of the present invention is to reduce the loading on programmable interface 94.

As is known to one of average skill in the art, a phase-locked loop is used to maintain an oscillating signal, such as the plurality of differential clocks produced by ring oscillator 90, substantially aligned with an input signal to recover data and/or a clock signal. In the example of FIG. 3, phase-locked loop 70 functions to recover data from the serial data input stream by phase-locking the oscillating frequency of ring oscillator 90 to the buffered serial data stream. Phase detector 78 produces a voltage that is proportional to the phase/frequency difference between the oscillating frequency of ring oscillator 90 and the received buffered serial data stream. The voltage produced from phase detector 78 is operably coupled to transconductance module 82 which produces a current proportional to the received voltage.

Transconductance module 82 is operably coupled to produce current to loop filter 86 which produces a corresponding output voltage, as is known to one of average skill in the art. The output voltage of loop filter 86 is coupled to ring oscillator 90 as a VCO input voltage. The VCO input voltage changes the bias on a plurality of delay stages in the ring oscillator. An increase in delay stage bias decreases the delay through the delay stage which increases the frequency of the ring oscillator.

As will become apparent with respect to the following figures, phase-locked loop 70 reduces the loading placed upon programmable interface 94 by providing a plurality of phase detector inputs, wherein each phase detector input is buffered by at least one buffer.

High data rate serial data, such as the serial data input stream produced by programmable interface 94, operating at one gigabit per second or greater, typically have signal levels of a few hundred millivolts or less. Consequently, an excessive load on the serial data stream may reduce the signal level to a point where the recovered data contains a large number of errors, i.e., a high bit error rate.

Another aspect of the present invention is to produce a plurality of differential clocks to phase detector 78 wherein each differential clock oscillates at a frequency that is substantially reduced from the high data rate of the received serial data input stream. As mentioned previously, accurate recovery of information from high data rate serial transmissions typically requires phase-locked loop components to operate at clock speeds equal to or higher than the high data rate serial data. Furthermore, higher data rates require greater bandwidth for a feedback loop of the phase-locked loop to operate correctly. These constraints and others present difficult design challenges in integrated circuit technology. The present invention mitigates the aforementioned design challenges by using a plurality of phase and data circuits, operating on different phases of the differential clocks, to simultaneously recover data from the serial data input stream.

Figure 4:
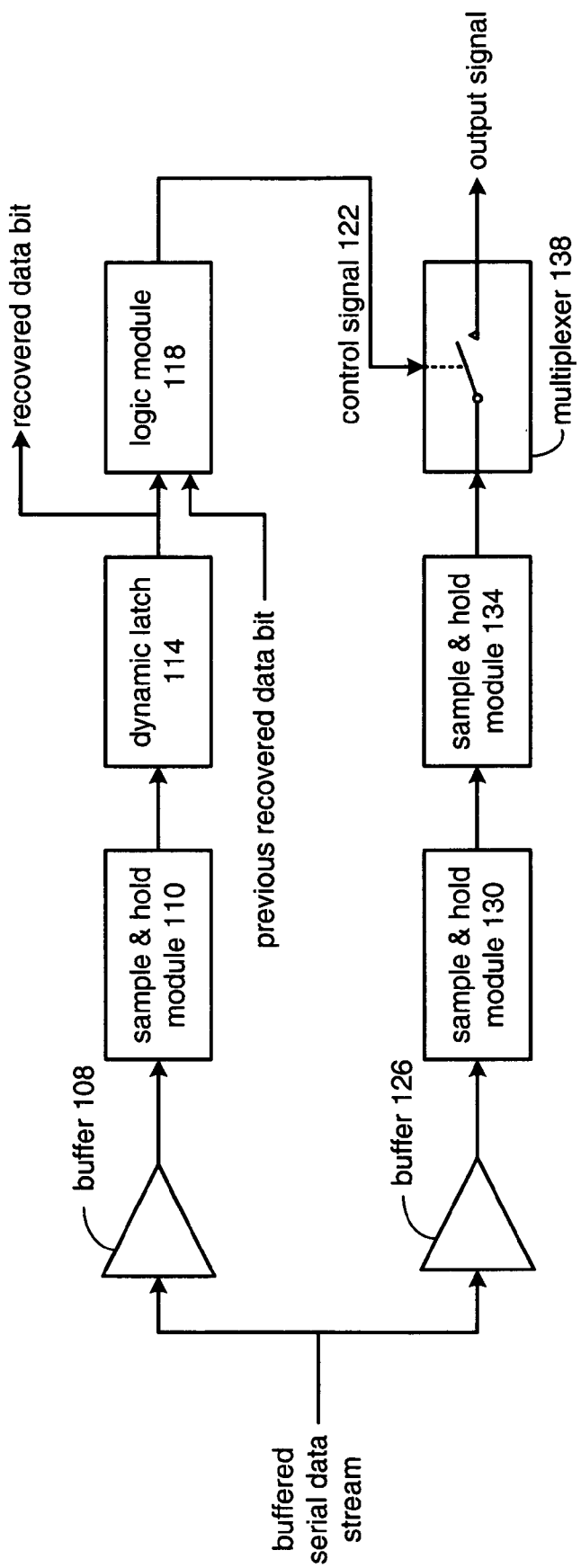
FIG. 4 is a functional block diagram illustrating operation of a data path and a phase path in a phase detector in one embodiment of the present invention.

FIG. 4 is a functional block diagram illustrating operation of a data path and a phase path in a phase detector in one embodiment of the present invention. As can be seen, the buffered serial data stream is received into a pair of buffers that isolate programmable interface 94 from the data path and phase path as well as amplifying and squaring up the buffered serial data stream. The data path comprises a buffer 108, a sample and hold module 110, a dynamic latch 114 and a logic module 118. The voltage output of buffer 108 is produced to an input of sample and hold module 110. The function of the sample and hold module 110 is to sample the buffered serial data stream voltage according to one of the plurality of differential clocks, amplify the voltage and produce the amplified voltage to the output. The operation of the sample and hold module 110 will be discussed in more detail with respect to FIG. 6. The sampled voltage value is produced to dynamic latch 114 that functions as a one-bit analog-to-digital (A-D) converter by amplifying the sampled voltage value to a full scale value (positive or negative) of a system supply voltage. The output of dynamic latch 114, representing a recovered data bit, is coupled to logic module 118 and to external downstream components.

Logic module 118 operates as a transition detector to prevent erroneous changes in the oscillating frequency of the ring oscillator (ring oscillator 90 of FIG. 3). Logic module 118, comprising a differential exclusive NOR (DXNOR) gate, compares the logic state of the recovered data bit from dynamic latch 114 with the previous (in time) recovered data bit produced by a dynamic latch (not shown) of another data path. The timing relationship between the recovered data bit and the previously recovered data bit ensures logic module 118 compares the logic state of two successive buffered serial data stream data bits in order to detect logic state transitions. When phase-locked, a lack of transition between two successive buffered serial data stream data bits produces a phase path output signal that is near a peak voltage. The peak voltage, if coupled to the transconductance module, would cause an increase in the VCO input voltage coupled to the ring oscillator causing the ring oscillator to erroneously change frequency. The output of logic module 118, illustrated herein as control signal 122, is coupled to a multiplexer disable input, here multiplexer 138.

As will be discussed with respect to FIG. 7, the DXNOR gate produces a logic one when both inputs (recovered data bit and previous recovered data bit) are at similar logic states indicating no transitions between the two successive data bits. Thus, when there is no transition in logic states between the recovered data bit and the previous recovered data bit, the output of DXNOR, control signal 122, disables the output of multiplexer 138. When disabled, the multiplexer 138 output signal is substantially zero thereby preventing erroneous changes in the ring oscillator oscillating frequency.

The phase path comprises a buffer 126, a pair of serially coupled sample and hold modules 130 and 134, and multiplexer 138. Serially coupled sample and hold modules 130 and 134, operating as was previously described, maintain a correct timing relationship between the data path and the phase path. Multiplexer 138 operates as a switch to couple the voltage produced from sample and hold module 134 to the transconductance module (transconductance module 82 of FIG. 3). The switch is closed when control signal 122 is a logic zero (transition in serial data) and open when control signal 122 is a logic one (no transition in serial data).

Figure 5:
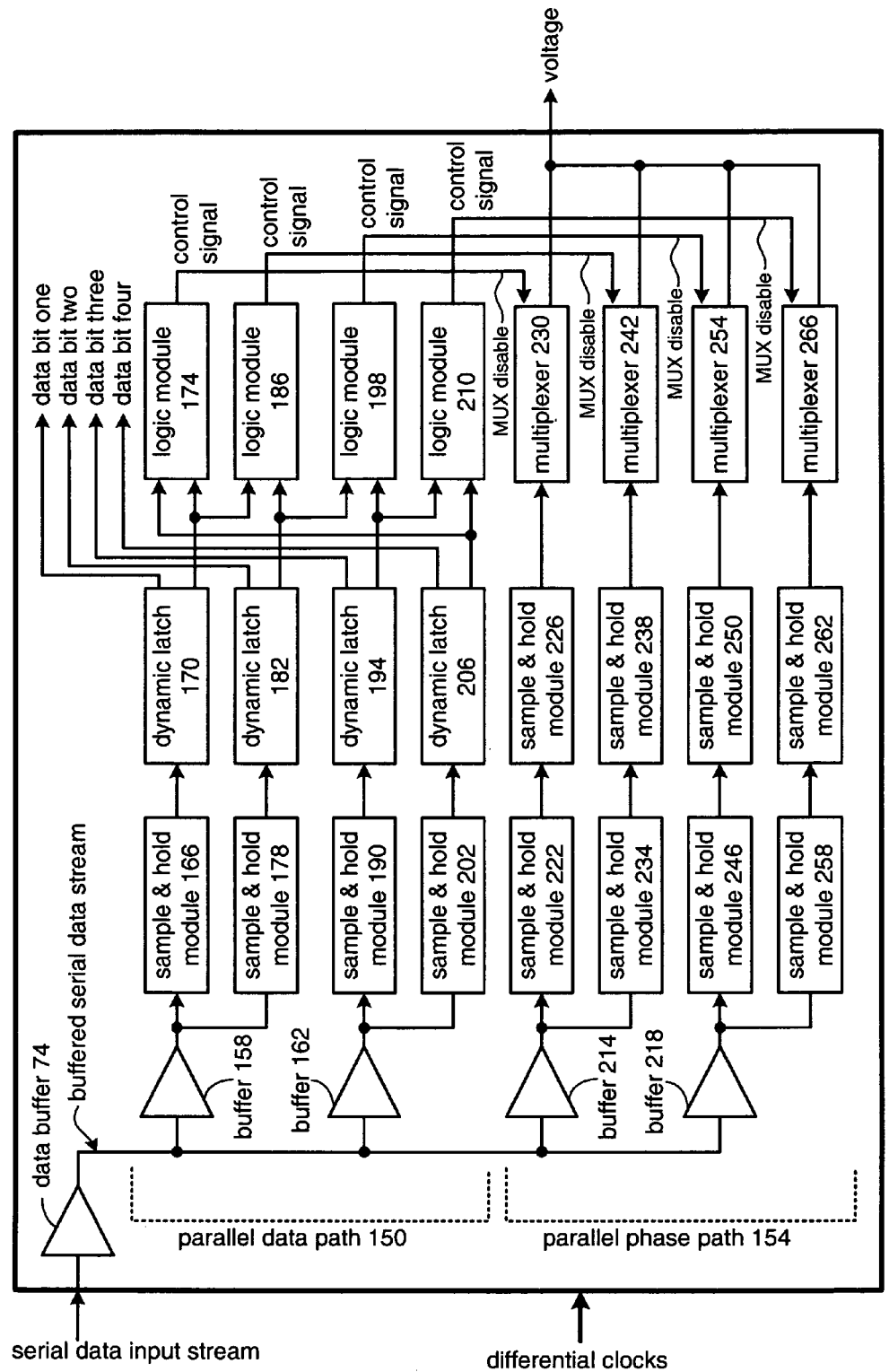
FIG. 5 is a schematic block diagram of a four-stage phase detector according to one embodiment of the present invention.

FIG. 5 is a schematic block diagram of a four-stage phase detector according to one embodiment of the present invention. Phase detector 78 comprises a data buffer 74, a parallel data path 150 and a parallel phase path 154. As was described with respect to FIG. 4, the data path recovers data from the buffered serial data stream and functions as a transition detector while the phase path maintains phase alignment between the differential clocks produced from the ring oscillator (ring oscillator 90 of FIG. 3) and the serial data input stream.

Parallel data path 150 comprises a buffer 158 and a buffer 162, each driving two data paths. Buffer 158 drives a data path comprising a sample and hold module 166, a dynamic latch 170, and a logic module 174. Buffer 158 also drives a data path comprising a sample and hold module 178, a dynamic latch 182, and a logic module 186. Buffer 162 drives a data path comprising a sample and hold module 190, a dynamic latch 194, and a logic module 198. Buffer 162 also drives a data path comprising a sample and hold module 202, a dynamic latch 206, and a logic module 210.

Parallel phase path 154 comprises buffers 214 and 218, each buffer driving two phase paths. Buffer 214 drives a phase path including a sample and hold module 222, a sample and hold module 226, and a multiplexer 230. Buffer 214 also drives a phase path including a sample and hold module 234, a sample and hold module 238, and a multiplexer 242. Similarly, buffer 218 drives a phase path including a sample and hold module 246, a sample and hold module 250, and a multiplexer 254. Buffer 218 also drives a phase path including a sample and hold module 258, a sample and hold module 262, and a multiplexer 266.

The components comprising phase detector 78 have been shown as single ended devices for clarity. However, phase detector 78 is typically formed as a differential circuit but may be formed single ended in an alternate embodiment.

A plurality of differential clocks, for example the differential clocks of ring oscillator 90 of FIG. 3, is coupled to phase detector 78 to provide timing for the phase detector. The differential clocks have a rising edge and a falling edge on each clock transition, as is known by one of average skill in the art. In one embodiment of the present invention, the ring oscillator produces four differential clocks, thus providing eight transitions that are used for timing. Although removed for clarity, the differential clocks are coupled to each data path and phase path such that each data path and each phase path samples four consecutive data bits of the buffered serial data stream. Using this technique, inventive phase detector 78 samples the high data rate serial data input stream, while the components comprising four-stage phase detector 78 need only run at a data rate that is one-quarter of the high data rate.

Each data path of parallel data path 150 recovers one bit of data from the buffered serial data stream. As can be seen in FIG. 5, phase detector 78 recovers data bits one through four. Phase detector 78 recovers the four data bits without placing excessive loading on the programmable interface 94 by distributing the loading across two layers of buffers. Data buffer 74 receives the serial data input stream from the programmable interface (programmable interface 94 of FIG. 3) and drives four loads, namely, buffers 158, 162, 214, and 218. The dual buffering greatly reduces the load on the programmable interface 94. Each of the aforementioned buffers drives a pair of data paths or a pair of phase paths. Phase detector 78 is designed so that each data path and each phase path represents substantially equal impedances to each buffer.

A pair of sample and hold modules are coupled serially in each phase path to maintain the timing relationships between the data paths and phase paths. For example, buffer 214 drives sample and hold module 222 which is coupled serially with sample and hold module 226. The addition of sample and hold module 226 inserts a timing delay substantially equal to the timing delay through the dynamic latch, for example dynamic latch 170. Without the timing delay introduced by the second sample and hold module, the phase path signals would propagate through the phase paths faster than the data signals propagate through the data paths. In this scenario, the signal in the phase path would propagate through the multiplexer before the corresponding data path logic module could produce the control signal (MUX disable) to disable the multiplexer in the event there were no transitions in the buffered serial data stream. Alternately, the phase path signal could propagate through the phase path before the multiplexer was enabled by a previous control signal. Under these conditions, the ring oscillator would not be tracking the serial data input stream but would be continuously searching for a locked condition. The constant changing of the ring oscillator frequency introduces phase noise into the ring oscillator. Phase noise can, as is known to one of average skill in the art, induce clock jitter into digital circuits causing, among other things, symbol errors and encoding errors.

Figure 6:
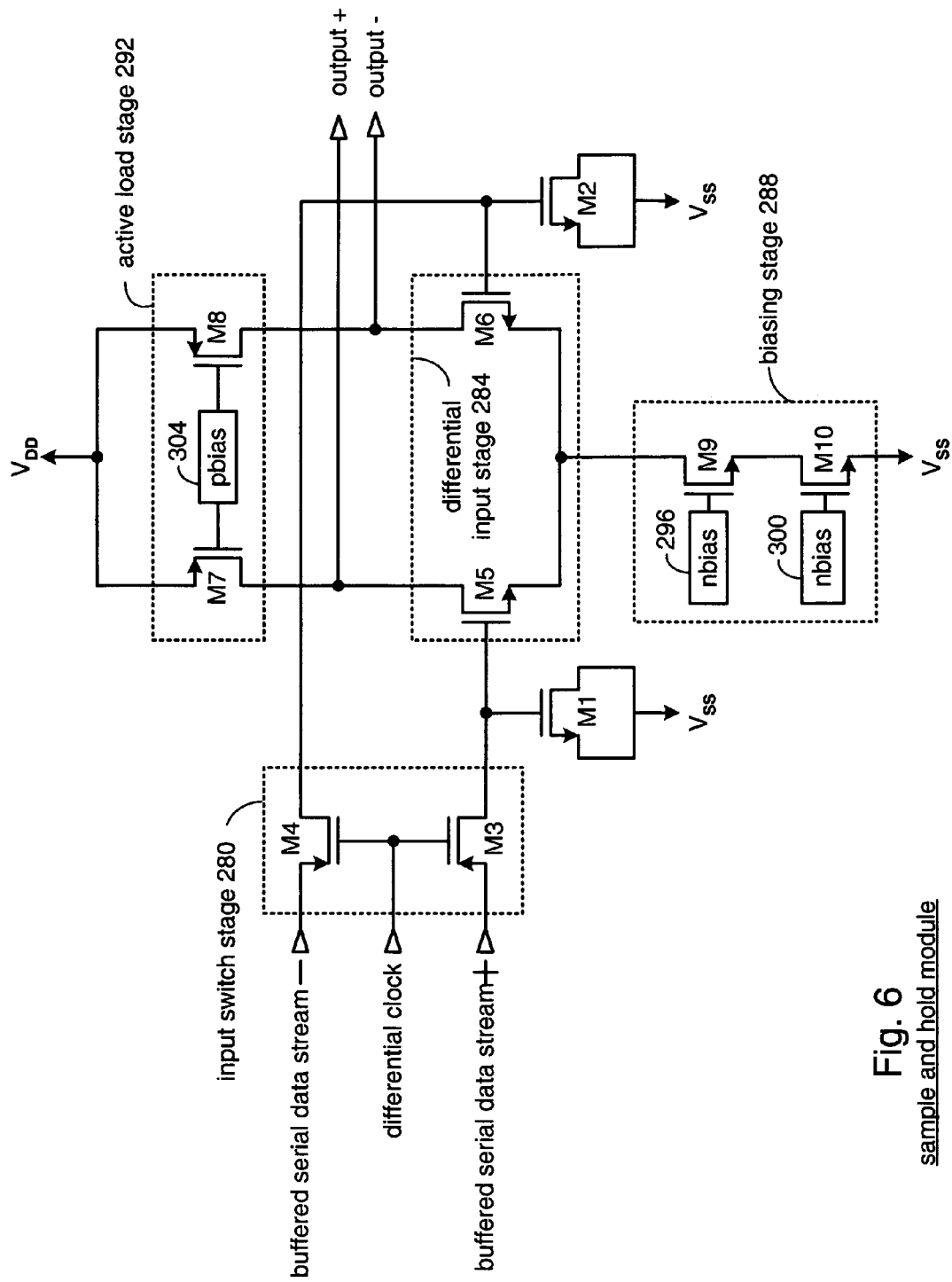
FIG. 6 is a schematic block diagram of a sample and hold module of the present invention.

FIG. 6 is a schematic block diagram of a sample and hold module of the present invention. As the name implies, the sample and hold module samples the input then holds the sampled value and couples it to the output after amplification. The buffered serial data stream is sampled at intervals determined by one clock of the plurality of differential clocks. Once sampled, the sample and hold module is decoupled from the buffered serial data stream.

The sample and hold module comprises an input switch stage 280, a differential input stage 284, a biasing stage 288, an active load stage 292, a first capacitor configured MOSFET M1, and a second capacitor configured MOSFET M2. Input switch stage 280 includes a pair of P-channel MOSFET transistors coupled to receive the buffered serial data stream. MOSFET transistors M3 and M4 operate in the linear region with a very low resistance when biased ON and a very high resistance when biased OFF. MOSFETs M3 and M4, therefore, operate as switches to couple the differential buffered serial data stream to differential input stage 284 and to first and second capacitor configured MOSFETs M1 and M2, respectively, when biased ON. The buffered serial data stream is decoupled from differential input stage 284 and first capacitor configured MOSFET M1 and second capacitor configured MOSFET M2 when the differential clock coupled to the gates of MOSFET transistors M3 and M4 biases M3 and M4 OFF.

First capacitor configured MOSFET M1 charges to the buffered serial data stream+ voltage when MOSFET switch M3 is biased ON by the differential clock. Similarly, second capacitor configured MOSFET M2 charges to the buffered serial data stream− voltage value when MOSFET switch M4 is biased ON by the differential clock. When MOSFET switches M3 and M4 are biased OFF, first and second capacitor configured MOSFETs M1 and M2, respectively, hold the voltage. The capacitor voltage is coupled to inputs of differential input stage 284.

Differential input stage 284 includes a differential configuration of N-channel MOSFETs M5 and M6. The capacitor voltage coupled to the gates of MOSFETs M5 and M6 is amplified by a gain factor (gain >1) set by active load stage 292 and biasing stage 288. The amplified voltage is coupled to differential output+ and output−. The differential outputs of the sample and hold module, in the described embodiment, couple to the dynamic latch in the data path or to the multiplexer in the phase path.

Active load stage 292 includes two P-channel MOSFETs, M7 and M8, biased into the linear region by a pbias block 304 wherein pbias block 304 biases MOSFETs M7 and M8 to a specified resistance value to achieve the desired gain factor.

Biasing stage 288 is coupled between the sources of MOSFETs M5 and M6 and a negative system supply voltage ($V_{ss}$). Biasing stage 288 includes two MOSFET current sources coupled in a cascode configuration to provide current to differential input stage 284. The saturation region resistance of MOSFET M9 is set by nbias block 296 coupled to a gate of MOSFET M9 while the saturation region resistance of MOSFET M10 is set by nbias block 300 coupled to a gate of MOSFET M10. Nbias blocks 296 and 300 may provide different bias levels for MOSFETs M9 and M10 in the described embodiment. While an ideal current source has an infinite output resistance, a MOSFET current source has some finite resistance so the cascode configuration is used to increase the output resistance of biasing stage 288.

As stated previously, the sample and hold module of the present invention samples the differential buffered serial data stream voltage and stores the voltage in the MOSFET configured capacitors. The sample and hold module amplifies the capacitor voltage by a gain greater than 1 and couples it to the next stage in the four-stage phase detector, either a dynamic latch in the data path or a multiplexer or another sample and hold module in the phase path.

Figure 7:
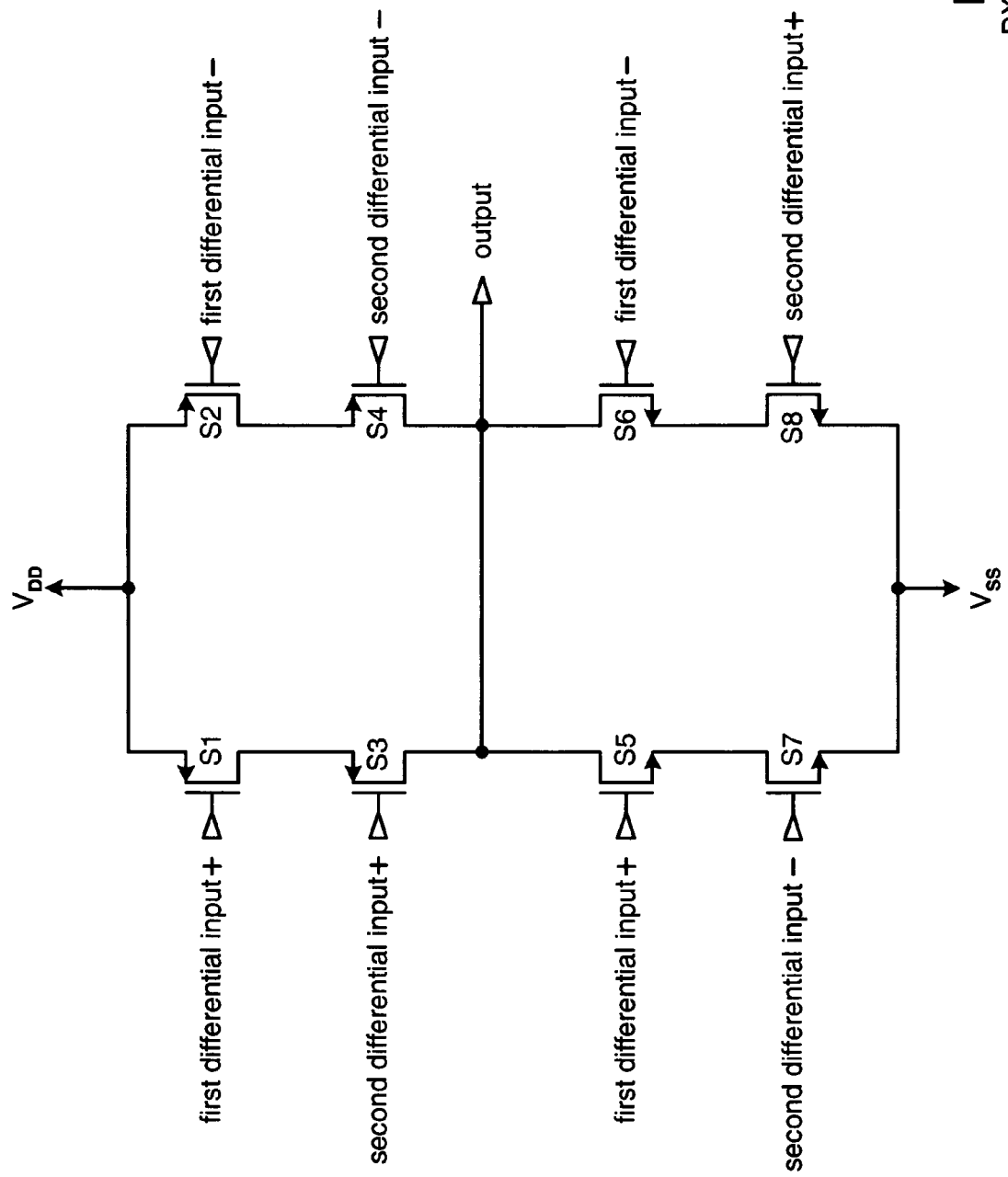
FIG. 7 is a schematic block diagram of a differential exclusive NOR (DXNOR) gate of the present invention.

FIG. 7 is a schematic block diagram of a differential exclusive NOR (DXNOR) gate of the present invention. An exclusive OR gate (XOR) produces a logic one when either input, but not both, are at a logic one. An exclusive NOR (XNOR) gate produces a logic one when both inputs are at similar logic levels (logic one or logic zero). The DXNOR gate, as was discussed with respect to FIG. 5, functions as a transition detector in the phase path to disable the multiplexer (multiplexer 230 of FIG. 5, for example) when two or more successive data bits are at similar logic levels. Disabling the multiplexers for a stream of similar data bits prevents the transconductance module from erroneously driving the ring oscillator to a full scale output.

The DXNOR gate comprises a series-parallel combination of PMOS transistors connected between a positive system supply voltage ($V_{DD}$) and the output and a series-parallel combination of NMOS transistors connected between the output and a negative supply voltage (Vss). Series connected PMOS transistors S1 and S3 are coupled in parallel with series connected PMOS transistors S2 and S4. Similarly, series connected NMOS transistors S5 and S7 are connected in parallel with series connected NMOS transistor S6 and S8. First differential input is received from the dynamic latch (dynamic latch 170 of FIG. 5, for example) while second differential input (recovered data bit of FIG. 4) is received from a preceding (in time) dynamic latch output (previously recovered data bit of FIG. 4). In operation, a logic one coupled to a PMOS transistor gate turns the transistor OFF while a logic zero turns the transistor ON. Alternately, a logic one coupled to a NMOS transistor gate turns the transistor ON while a logic zero turns the transistor OFF.

When transitions occur in the data path, first differential input and second differential input will be at dissimilar logic levels. In this state, one PMOS transistor in each branch of the series connection will be OFF creating an open circuit between $V_{DD}$ and the output. Since first differential input− and second differential input− are inverted with respect to first differential input+ and second differential input+, respectively, both series connected NMOS transistors in one branch of the parallel connection will be ON thereby coupling the output to Vss (logic zero) and activating the multiplexer output. For example, when first differential input+ is logic zero and second differential input+ is logic one, PMOS transistors S1 and S4 are ON while PMOS transistors S2 and S3 are OFF. However, NMOS transistors S6 and S7 are ON (S5 and S7 OFF) thereby coupling the output to Vss (logic zero) and to the multiplexer disable input.

If, however, there are no transitions in the data path for at least two successive data bits, i.e., two successive data bits are at similar logic levels, the DXNOR will disable the respective multiplexer in the phase path to prevent the phase sample from erroneously changing the ring oscillator frequency. Assuming first differential input+ and second differential input+ are both logic zero, at least one NMOS transistor in each series branch will be OFF. However, PMOS transistors S1 and S3 will be ON (S2 and S4 OFF) thus coupling the DXNOR output to $V_{DD}$ (logic one) and coupling the logic one output to the multiplexer disable input. The disabled multiplexer output is effectively disconnected from the transconductance module input.

FIGS. 8A and 8B illustrate buffered serial data stream sampling with data transitions and without data transitions, respectively, according to one embodiment of the present invention. In the example of FIG. 8A, the buffered serial data stream is sampled by one phase path and one data path of the phase detector (phase detector 78 of FIG. 5). The phase detector produces a data sample 320 and a phase sample 324 during one bit period of the buffered serial data stream. The buffered serial data stream of FIG. 8A contains data transitions so the phase path operates to adjust the oscillating frequency of the ring oscillator to phase align the oscillating frequency with the buffered serial data stream. The voltage produced by phase sample 324 causes the transconductance module (transconductance module 82 of FIG. 3) to produce a current that, when converted to the VCO input voltage by the loop filter, changes the ring oscillator frequency until phase sample 324 is at the zero crossing of the buffered serial data stream. At this point the ring oscillator frequency is phase aligned with the buffered serial data stream.

Data sample 328 and phase sample 332 illustrate the sampling alignment when the ring oscillator frequency and buffered serial data stream are phase aligned or phase-locked. Data sample 328 is positioned at a peak value in the center of the data bit while the phase sample is positioned at the buffered serial data stream zero crossing. The voltage produced by the phase path will be substantially zero so the transconductance module does not produce current to the loop filter thereby holding the VCO input voltage produced by the loop filter substantially constant. The phase sample will remain substantially zero when phase-locked. As further shown in FIG. 8A, when phase-locked, the sample and hold modules produce data samples that are 90 degrees out of phase with respect to the phase samples. This ensures that, when phase-locked, the data samples will be substantially centered in the data bit.

FIG. 8B illustrates data sampling without data transitions. In the example of FIG. 8B, two successive data bits have the same logic state. Data sample 336 and data sample 344 are at approximately the same voltage, as are phase sample 340 and phase sample 348. One aspect of the present invention is to prevent the ring oscillator from erroneously changing frequency and, thereby, losing phase-lock. Without the inventive circuitry of the present invention, the voltage produced by phase samples 340 and 348 will drive the ring oscillator frequency to full scale. However, as discussed with respect to FIG. 7, the DXNOR gate produces a logic one when two successive data bits have similar logic states. The logic one from the DXNOR gate is coupled to the multiplexer disable input effectively removing the multiplexer voltage from the transconductance module input. The multiplexer remains disabled until there is a data transition in the buffered serial data stream. The next bit period produces data sample 352 and phase sample 356. Because phase sample 348 and phase sample 356 have dissimilar logic states, the DXNOR gate output returns to logic zero and phase sample 356 is coupled through the multiplexer to the transconductance module. The transconductance module produces a current that will, when converted to the VCO input voltage by the loop filter, operate to position the phase sample back to the zero crossing.

Figure 9:
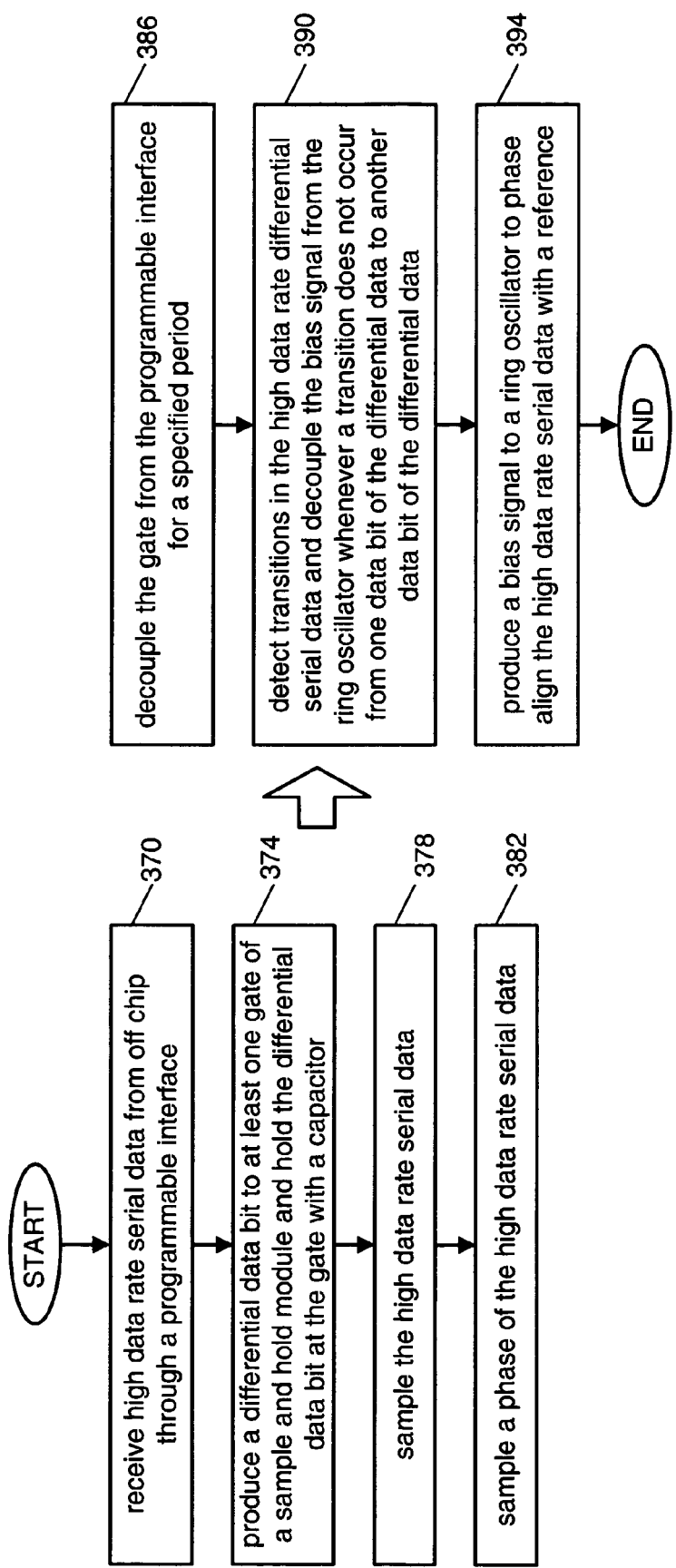
FIG. 9 is a flowchart of a method of detecting a phase difference between a reference signal and a clock signal for high data rate differential serial data in programmable fabric, according to one embodiment of the present invention.

FIG. 9 is a flowchart of a method of detecting a phase difference between a reference signal and a clock signal for high data rate differential serial data in programmable fabric according to one embodiment of the present invention. The phase detector receives high data rate serial data from off chip through a programmable interface (step 370) and provides the serial data to data paths and phase paths. To sample the high data rate serial data, the phase detector produces a differential data bit to at least one gate of a sample and hold module and holds the differential data bit at the gate with a capacitor (step 374). The data path samples the high data rate serial data (step 378) while the phase path samples a phase of the high data rate serial data (step 382). After sampling, the phase detector decouples the gate from the programmable interface for a specified period (step 386). A plurality of logic modules detects transitions in the high data rate differential serial data and decouples the bias signal from the ring oscillator whenever a transition does not occur from one data bit of the differential data to another data bit of the differential data (step 390). The data samples are produced as a bias signal to a ring oscillator to phase align the high data rate serial data with a reference (step 394) wherein the reference is typically a clock produced from the ring oscillator.

The invention disclosed herein is susceptible to various modifications and alternative forms. Specific embodiments therefore have been shown by way of example in the drawings and detailed description. It should be understood, however, that the drawings and detailed description thereto are not intended to limit the invention to the particular form disclosed, but on the contrary, the invention is to cover all modifications, equivalents and alternatives falling within the sprit and scope of the present invention as defined by the claims.

What is claimed is:

1. A phase-locked loop (PLL) for high data rate serial digital communications receiving serial data at a rate that exceeds one gigabits per second, the phase-locked loop comprising:
   a ring oscillator operating as a voltage controlled oscillator (VCO) that produces four differential clocks;
   a phase detector coupled to receive the four differential clocks and further coupled to receive at least one serial data input stream wherein the phase detector includes:
       a data buffer for receiving and driving the at least one serial data input stream to produce a buffered serial data stream;
       a plurality of buffers coupled to receive the buffered serial data stream for buffering and reducing loading of downstream elements of the phase detector for the data buffer wherein the plurality of buffers provide buffering for a plurality of data paths and phase paths;
       wherein each data path comprises a sample and hold module coupled serially with a dynamic latch that is further coupled serially with a logic module;
       wherein each phase path comprises a pair of sample and hold modules coupled serially and further coupled serially with a multiplexer; and wherein each multiplexer is coupled to receive a control signal produced by the logic module to cause the multiplexer to not produce an output voltage.

2. The PLL of claim 1 further including a transconductance module coupled to an output of each multiplexer to receive the output voltage therefrom, the transconductance module converting the voltage to a current.

3. The PLL of claim 1 further including a loop filler for converting the transconductance module current to a VCO input voltage.

4. The PLL of claim 1 wherein the ring oscillator produces an oscillation based upon the VCO input voltage.

5. The PLL of claim 1 wherein each of the four buffers is coupled to one data path and one phase path.

6. The PLL of claim 1 wherein two of the four buffers are each coupled to two data paths.

7. The PLL of claim 1 wherein two of the four buffers are each coupled to two phase paths.

8. The PLL of claim 1 wherein the loop filter produces the VCO input voltage to the ring oscillator as a bias signal wherein an increased level of bias decreases a delay of each delay element within the ring oscillator to increase a frequency of oscillation produced by the ring oscillator.

9. The PLL of claim 8 wherein the transconductance module produces the current to adjust the frequency of oscillation to result in the sample and hold modules of the phase paths to sample at a zero crossing of the buffered serial data stream.

10. The PLL of claim 9 wherein the transconductance module produces no current to the loop filter whenever the sample and hold modules of the phase paths sample at a zero crossing of the buffered serial data stream.

11. The PLL of claim 9 wherein the sample and hold modules of the data paths sample at a phase that is ninety degrees out of phase with respect to sample points of the sample and hold modules of the phase paths.

12. The PLL of claim 11 wherein the sample and hold modules of the data paths sample at a peak of the buffered serial data stream.

13. The PLL of claim 1 wherein the logic module is a differential exclusive NOR (DXNOR) gate.

14. The PLL of claim 13 wherein the DXNOR gate comprises eight MOSFET devices coupled to produce a differential logic one only when both differential inputs are set to a similar logic state.

15. The PLL of claim 13 wherein the DXNOR gate comprises eight MOSFET devices coupled to produce a differential logic zero only when both differential inputs are set to a dissimilar logic state.

16. The PLL of claim 13 wherein four of the eight MOSFETs are coupled between an output of the DXNOR gate and a positive supply and are p-type MOSFETs.

17. The PLL of claim 16 wherein four of the eight MOSFETs are coupled between an output of the DXNOR gate and a negative supply and are n-type MOSFETs.

18. The PLL of claim 16 wherein the DXNOR gate receives logic states of two consecutive data bits as first and second differential inputs and wherein the DXNOR gate produces a logic one to a corresponding multiplexer based upon the differential inputs being of a similar logic state to prevent the multiplexer from coupling a voltage to the transconductance module to prevent the oscillator from receiving additional bias.

19. A programmable fabric phase-locked loop (PLL) for high data rate serial digital communications receiving serial data, the phase-locked loop comprising:
  a programmable interface for receiving high data rate serial data;
  a ring oscillator operating as a voltage controlled oscillator that produces four differential clocks;
  a phase detector coupled to receive the four differential clocks and further coupled to receive at least one serial data input stream from the programmable interface wherein the phase detector further includes:
  a sample and hold module further comprising a capacitor configured MOSFET coupled to a gate of an input MOSFET of the sample and hold module wherein the capacitor holds an input value for the gate;
  a logic module for detecting a lack of transition between two data bits produced by the sample and hold module wherein the logic module disables a multiplexer from producing a signal to a transconductance module that produces a biasing signal for the ring oscillator;
  a data buffer for receiving and driving the at least one serial data input stream to produce a buffered serial data stream;
  four buffers coupled to receive the buffered serial data stream for buffering and reducing loading of downstream elements of the phase detector for the data buffer wherein the four buffers provide buffering for four data paths and four phase paths;
  wherein each data path comprises a sample and hold module coupled serially with a dynamic latch that is further coupled serially with the logic module;
  wherein each phase path comprises a pair of sample and hold modules coupled serially and further coupled serially with a multiplexer;
  wherein each multiplexer is coupled to receive a control signal produced by the logic module to cause the multiplexer to not produce an output voltage;
  wherein the phase-locked loop further includes: a transconductance module coupled to an output of each multiplexer to receive a voltage therefrom, the transconductance module converting the voltage to a current;
  a loop filter for converting the transconductance module current to a VCO input voltage; and
  the ring oscillator producing an oscillation based upon the VCO input voltage.

20. The PLL of claim 19 wherein each of the four buffers is coupled to one data path and one phase path.

21. The PLL of claim 19 wherein two of the four buffers are each coupled to two data paths.

22. The PLL of claim 19 wherein two of the four buffers are each coupled to two phase paths.

23. The PLL of claim 19 wherein the loop filter produces an output voltage that is produced to the ring oscillator as a bias signal wherein an increased level of bias decreases a delay of each delay element within the ring oscillator to increase a frequency of oscillation produced by the ring oscillator.

24. The PLL of claim 23 wherein the transconductance module produces the current to adjust the frequency of oscillation to result in the sample and hold modules of the phase paths to sample at a zero crossing of the buffered serial data stream.

25. The PLL of claim 24 wherein the transconductance module produces no current to the loop filter whenever the sample and hold modules of the phase paths sample at a zero crossing of the buffered serial data stream.

26. The PLL of claim 24 wherein the sample and hold modules of the data paths sample at a phase that is ninety degrees out of phase with respect to sample points of the sample and hold modules of the phase paths.

27. The PLL of claim 26 wherein the sample and hold modules of the data paths sample at a peak of the buffered serial data stream.

28. The PLL of claim 19 wherein the logic module is a differential exclusive NOR (DXNOR) gate.

29. The PLL of claim 28 wherein the DXNOR gate comprises eight MOSFET devices coupled to produce a differential logic one only when both differential inputs are set to a similar logic state.

30. The PLL of claim 28 wherein the DXNOR gate comprises eight MOSFET devices coupled to produce a differential logic zero only when both differential inputs are set to a dissimilar logic state.

31. The PLL of claim 28 wherein four of the eight MOSFETs are coupled between an output of the DXNOR gate and a positive supply and are p-type MOSFETs.

32. The PLL of claim 31 wherein four of the eight MOSFETs are coupled between an output of the DXNOR gate and a negative supply and are n-type MOSFETs.

33. The PLL of claim 32 wherein the DXNOR gate receives logic states of two consecutive data bits as first and second differential inputs and wherein the DXNOR gate produces a logic one to a corresponding multiplexer based upon the differential inputs being of a similar logic state to prevent the multiplexer from coupling a voltage to the transconductance module to prevent the oscillator from receiving additional bias.

* * * * *